United States Patent
Lin et al.

(10) Patent No.: US 8,552,530 B2
(45) Date of Patent: Oct. 8, 2013

(54) VERTICAL TRANSIENT VOLTAGE SUPPRESSORS

(75) Inventors: Kun-Hsien Lin, Hsinchu (TW); Zi-Ping Chen, Taipei County (TW); Che-Hao Chuang, Hsinchu (TW); Ryan Hsin-Chin Jiang, Taipei (TW)

(73) Assignee: Amazing Microelectronics Corp., Hsin-Chu (TW)

( * ) Notice: Subject to any disclaimer, the term of this patent is extended or adjusted under 35 U.S.C. 154(b) by 413 days.

(21) Appl. No.: 12/848,531

(22) Filed: Aug. 2, 2010

(65) Prior Publication Data
US 2012/0025350 A1 Feb. 2, 2012

(51) Int. Cl.
*H01L 29/06* (2006.01)
(52) U.S. Cl.
USPC .......... 257/546; 257/112; 257/173; 257/168; 257/355; 257/565; 257/552; 257/557; 257/E29.327; 257/E29.215; 361/56; 361/111
(58) Field of Classification Search
USPC .................. 257/546, 112, 173, 168, E29.327, 257/E29.215, 355, 565, 552, 557; 361/56, 361/111
See application file for complete search history.

(56) References Cited

U.S. PATENT DOCUMENTS

| 2008/0188047 A1* | 8/2008 | Kim et al. | 438/234 |
| 2009/0032838 A1* | 2/2009 | Tseng et al. | 257/133 |
| 2009/0045457 A1* | 2/2009 | Bobde | 257/328 |
| 2009/0050970 A1* | 2/2009 | Schneider et al. | 257/362 |

* cited by examiner

*Primary Examiner* — Matthew Reames
*Assistant Examiner* — Benjamin Tzu-Hung Liu
(74) *Attorney, Agent, or Firm* — WPAT, PC; Justin King

(57) ABSTRACT

A vertical transient voltage suppressor for protecting an electronic device is disclosed. The vertical transient voltage includes a conductivity type substrate having highly doping concentration; a first type lightly doped region is arranged on the conductivity type substrate, wherein the conductivity type substrate and the first type lightly doped region respectively belong to opposite types; a first type heavily doped region and a second type heavily doped region are arranged in the first type lightly doped region, wherein the first and second type heavily doped regions and the conductivity type substrate belong to same types; and a deep first type heavily doped region is arranged on the conductivity type substrate and neighbors the first type lightly doped region, wherein the deep first type heavily doped region and the first type lightly doped region respectively belong to opposite types, and wherein the deep first type heavily doped region is coupled to the first type heavily doped region.

15 Claims, 8 Drawing Sheets

US 8,552,530 B2

VERTICAL TRANSIENT VOLTAGE SUPPRESSORS

TECHNICAL FIELD

The present disclosure relates to a vertical transient voltage suppressor (TVS), and more particularly, to a vertical transient voltage suppressor for electrostatic discharge (ESD) protection.

TECHNICAL BACKGROUND

As the IC device sizes have been shrunk to nanometer scale, the consumer electronics, like the laptop and mobile devices, have been designed to be much smaller than ever. Without suitable protection devices, the functions of these electronics could be reset or even damaged under ESD events. Currently, all consumer electronics are expected to pass the ESD test requirement of IEC 61000-4-2 standard. TVS is generally designed to bypass the ESD energy, so that the electronic systems can be prevented from ESD damages. The working principle of TVS is shown in FIG. 1. In FIG. 1, the TVS devices 10 are connected in parallel with the protected circuits 12 on the PCB (Printed Circuit Board). These TVS devices 10 would be triggered immediately when the ESD event is occurred. In that way, each TVS device 10 can provide a superiorly low resistance path for discharging the transient ESD current, so that the energy of the ESD transient current can be bypassed by the TVS devices.

FIG. 1B is a cross-sectional view showing a traditional vertical TVS. The traditional vertical TVS included a N+ type substrate, an Epi layer, a P− type doped well and a N type heavily doped region. The P− type doped well is arranged in the Epi layer on the N+ type substrate, and the N type heavily doped region is arranged in the P− type doped well. FIG. 1C is a schematic diagram showing a traditional equivalent circuit with a pair of vertical transistors of FIG. 1B. In the traditional equivalent circuit, one of pair of vertical transistor is oppositely coupled to another of pair of vertical transistor. However, the transitional vertical TVS has some disadvantages as follows: (1) the breakdown voltages (Vceo) are not symmetric because the structures of the traditional vertical TVS are not symmetric; (2) the I-V characteristic are not symmetric for positive-side curve and negative-side curve; (3) the ability of ESD protection under positive and negative ESD stresses will not be the same; (4) the variation in breakdown voltage of the structure of the traditional vertical TVS is large because the out-diffusion effect of heavily doped substrate during the process.

For the reason that the traditional vertical TVS could not provide effectively ESD protection, a need has arisen to propose a novel scheme that may adaptively provide effectively ESD protection and overcome the drawbacks of the prior art.

TECHNICAL SUMMARY

In view of the foregoing, it is an object of the present invention to provide a vertical transient voltage suppressor for ESD protection that may adaptively provide effectively ESD protection under positive and negative ESD stresses, decrease the variation in breakdown voltage and generate symmetric I-V characteristic curves and breakdown voltages.

In an exemplary embodiment, the present disclosure provides a vertical transient voltage suppressor for ESD protection, comprising:
a conductivity type substrate having highly doping concentration;
a first type lightly doped region, arranged on the conductivity type substrate, wherein the conductivity type substrate and the first type lightly doped region respectively belong to opposite types;
a first type heavily doped region and a second type heavily doped region, arranged in the first type lightly doped region, wherein the first and second type heavily doped regions and the conductivity type substrate belong to same types; and
a deep first type heavily doped region, arranged on the conductivity type substrate and neighboring the first type lightly doped region, wherein the deep first type heavily doped region and the first type lightly doped region respectively belong to opposite types, and wherein the deep first type heavily doped region is coupled to the first type heavily doped region.

In another exemplary embodiment, the present disclosure provides a vertical transient voltage suppressor for ESD protection, comprising:
a conductivity type substrate having highly doping concentration;
a first type lightly doped region, arranged on the conductivity type substrate, wherein the first type lightly doped region and the conductivity type substrate respectively belong to opposite types;
a first type heavily doped region, a second type heavily doped region and a third type heavily doped region, arranged in the first type lightly doped region, wherein the first and second type heavily doped regions and the conductivity type substrate belong to same types, and wherein the third type heavily doped region and the first type heavily doped region respectively belong to opposite types; and
a deep first type heavily doped region, arranged on the conductivity type substrate and neighboring the first type lightly doped region, wherein the deep first type heavily doped region and the first type lightly doped region respectively belong to opposite types, and wherein the deep first type heavily doped region is coupled to the first and third type heavily doped regions.

In the other exemplary embodiment, the present disclosure provides a vertical transient voltage suppressor for ESD protection, comprising:
a conductivity type substrate having highly doping concentration;
a first type lightly doped region, arranged on the conductivity type substrate, wherein the first type lightly doped region and the conductivity type substrate respectively belong to opposite types;
a first type heavily doped region and a second type heavily doped region, arranged in the first type lightly doped region, wherein the first and second type heavily doped regions respectively belong to opposite types, and wherein the second type heavily doped region and the conductivity type substrate belong to same types; and
a deep first type heavily doped region, arranged on the conductivity type substrate and neighboring the first type lightly doped region, wherein the deep first type heavily doped region and the first type lightly doped region respectively belong to opposite types, and wherein the deep first type heavily doped region is coupled to the first type heavily doped region Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For your esteemed members of reviewing committee to further understand and recognize the fulfilled functions and structural characteristics of the disclosure, several exemplary embodiments cooperating with detailed description are presented as the follows.

Figure 1A:
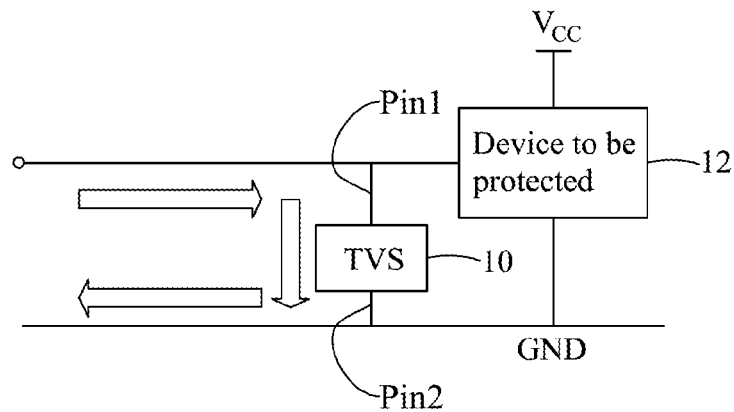
FIG. 1A is a schematic diagram showing a traditional transient voltage suppressor connected with a protected circuit.
Figure 1B:
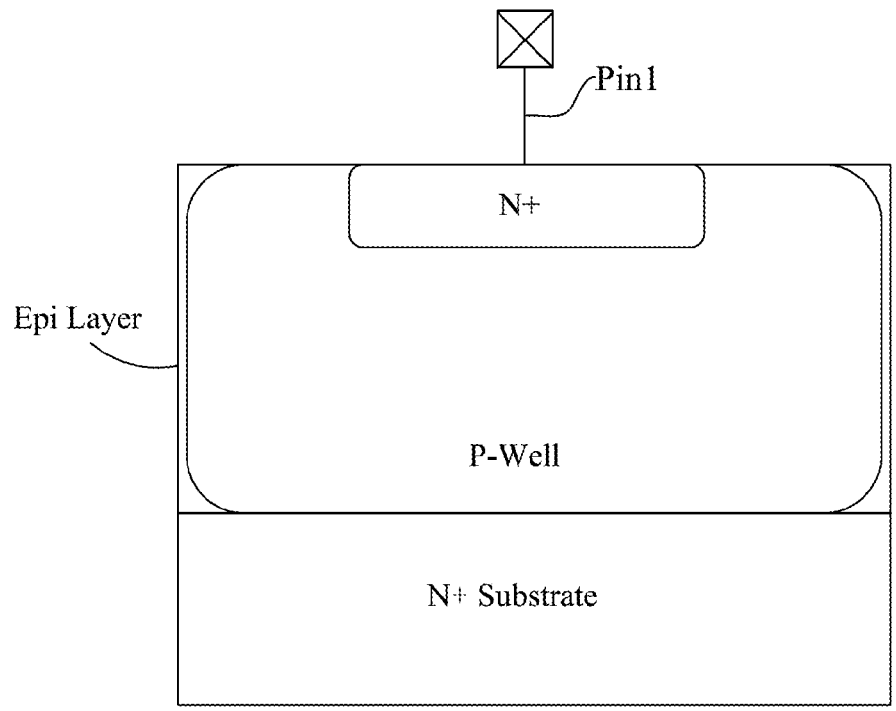
FIG. 1B is a cross-sectional view showing a traditional vertical TVS.
Figure 1C:
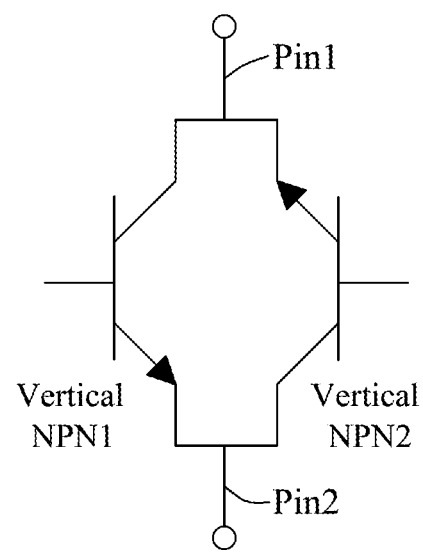
FIG. 1C is a schematic diagram showing a traditional equivalent circuit with a pair of vertical transistors of FIG. 1B.
Figure 2A:
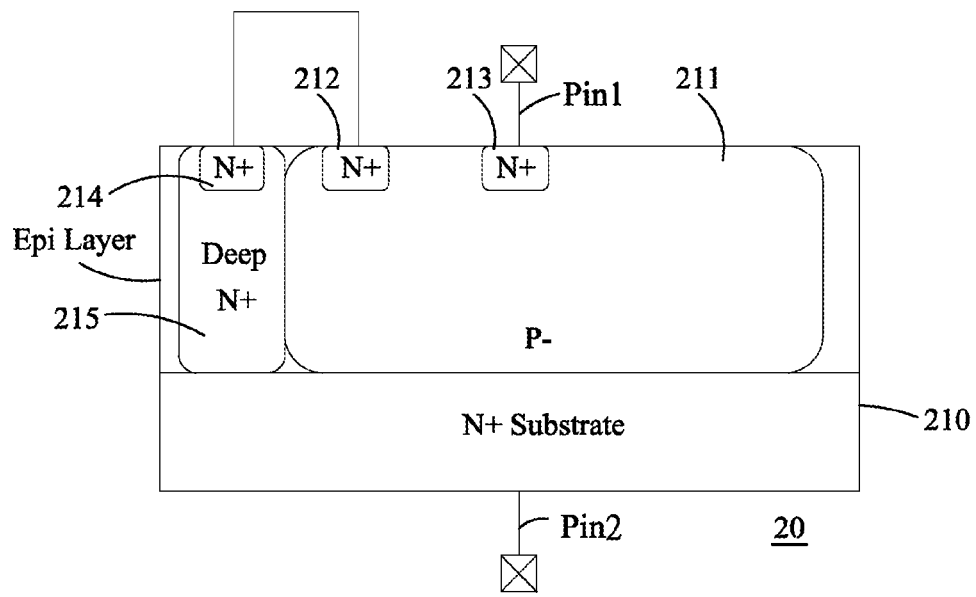
FIG. 2A is a cross-sectional view showing a vertical TVS 20 with single-channel according to one embodiment of the present invention.

FIG. 2A is a cross-sectional view showing a vertical TVS 20 with single-channel according to one embodiment of the present invention. The vertical TVS 20 includes a conductivity type substrate 210 having highly doping concentration, a first type lightly doped region 211, a first type heavily doped region 212 and a second type heavily doped region 213 and a deep first type heavily doped region 215. The first type lightly doped region 211 arranged on the conductivity type substrate 210 and the conductivity type substrate 210 belong to opposite types. The first and second type heavily doped regions 212, 213 arranged in the first type lightly doped region 211 and the conductivity type substrate 210 belong to same types. The deep first type heavily doped region 215 arranged on the conductivity type substrate 210 and neighboring the first type lightly doped region 211 is coupled to the first type heavily doped region 212, wherein the deep first type heavily doped region 215 and the first type lightly doped region 211 belong to opposite types. Furthermore, the first type lightly doped region 211 and the deep first type heavily doped region 215 are formed in the Epi layer on the conductivity type substrate 210, and a low resistance path is formed by the conductivity type substrate 210, the deep first type heavily doped region 215 and the first type heavily doped region 212. The vertical TVS 20 of the present invention further includes a third type heavily doped region 214 arranged in the deep first type heavily doped region 215 for coupling to the first type heavily doped region 212 and lowing the resistance between the deep first type heavily doped region 215 and the first type heavily doped region 212, wherein the third type heavily doped region 214 and the deep first type heavily doped region 215 belong to same types.

Figure 2B:
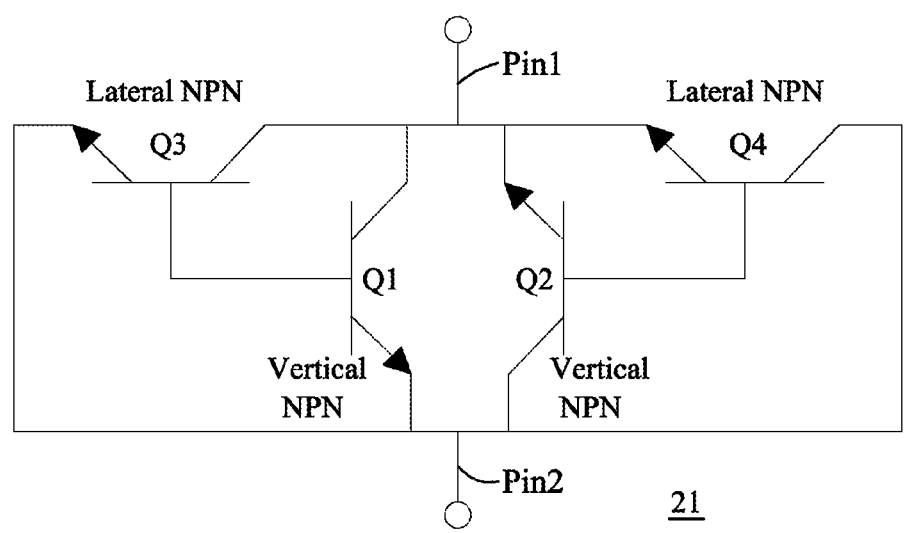
FIG. 2B is a schematic diagram showing an equivalent circuit 21 of FIG. 2A.

FIG. 2B is a schematic diagram showing an equivalent circuit 21 of FIG. 2A. The equivalent circuit 21 includes a pair of vertical transistors (Q1 and Q2), a first lateral transistor Q3 and a second lateral transistor Q4. The pair of vertical transistors is formed by the conductivity type substrate 210, the first type lightly doped region 211 and the second type heavily doped region 213, wherein a first vertical transistor Q1 of the pair of vertical transistors is oppositely coupled to a second vertical transistor Q2 of the pair of vertical transistors. The first lateral transistor Q3 and the second lateral transistor Q4 are formed by the conductivity type substrate 210, the first type lightly doped region 211, the deep first type heavily doped region 215, the first type heavily doped region 212 coupled to the deep first type heavily doped region 215 and the second type heavily doped region 213, wherein the first and second lateral transistors Q3, Q4 are respectively coupled to the first vertical transistor Q1 and the second vertical transistor Q2 in parallel.

In the embodiment, the first P type lightly doped region 211 is arranged on the conductivity N type substrate 210 having highly doping concentration. The first N type heavily doped region 212 and the second N type heavily doped region 213 are arranged in the first P type lightly doped region 211 and the deep first N type heavily doped region 215 arranged on the conductivity N type substrate 210 neighbors the first P type lightly doped region 211 and coupled to the first N type heavily doped region 212. Thereby, the equivalent circuit 21 included the pair of vertical NPN BJTs and the first and second lateral NPN BJTs is formed. According to the embodiment, the vertical TVS 20 is bi-directional TVS. With respect to the equivalent circuit 21, the breakdown voltages of the first and second lateral NPN BJTs are the same. In addition, the breakdown voltage of the lateral NPN BJT can be easily adjusted to be smaller than the vertical NPN BJT by the process, resulting in the I-V characteristic of the equivalent circuit is symmetric for positive-side curve and negative-side curve. Moreover, the ability of ESD protection under positive and negative ESD stresses will be the same. Additionally, the ESD protection efficiency of the TVS can be improved within the limited layout area because the ESD current can be discharged through both lateral and vertical NPN BJTs under ESD stresses. The third N type heavily doped region 214 is arranged in the deep first N type heavily doped region 215 according to the actual requirement for coupling to the first N type heavily doped region 212 and further lowing the resistance between the deep first N type heavily doped region 215 and the first N type heavily doped region 212.

According to another embodiment, the first N type lightly doped region 211 is arranged on the conductivity P type substrate 210 having highly doping concentration. The first P type heavily doped region 212 and the second P type heavily doped region 213 are arranged in the first N type lightly doped region 211 and the deep first P type heavily doped region 215 arranged on the conductivity P type substrate 210 neighbors the first N type lightly doped region 211 and coupled to the first P type heavily doped region 212. Thereby, the equivalent circuit 21 included the pair of vertical PNP BJTs and the first and second lateral PNP BJTs is formed. According to the embodiment, the vertical TVS 20 is bi-directional TVS. With respect to the equivalent circuit 21, the breakdown voltages of the first and second lateral PNP BJTs are the same. In addition, the breakdown voltage of the lateral PNP BJT can be easily adjusted to be smaller than the vertical PNP BJT by the process, resulting in the I-V characteristic of the equivalent circuit is symmetric for positive-side curve and negative-side curve. Moreover, the ability of ESD protection under positive and negative ESD stresses will be the same. Additionally, the ESD protection efficiency of the TVS can be improved within the limited layout area because the ESD current can be discharged through both lateral and vertical PNP BJTs under ESD stresses. The vertical TVS 20 further includes the third P type heavily doped region 214 arranged in the deep first P type heavily doped region 215 according to the actual requirement for coupling to the first P type heavily doped region 212 and further lowering the resistance between the deep first P type heavily doped region 215 and the first P type heavily doped region 212.

Figure 2C:
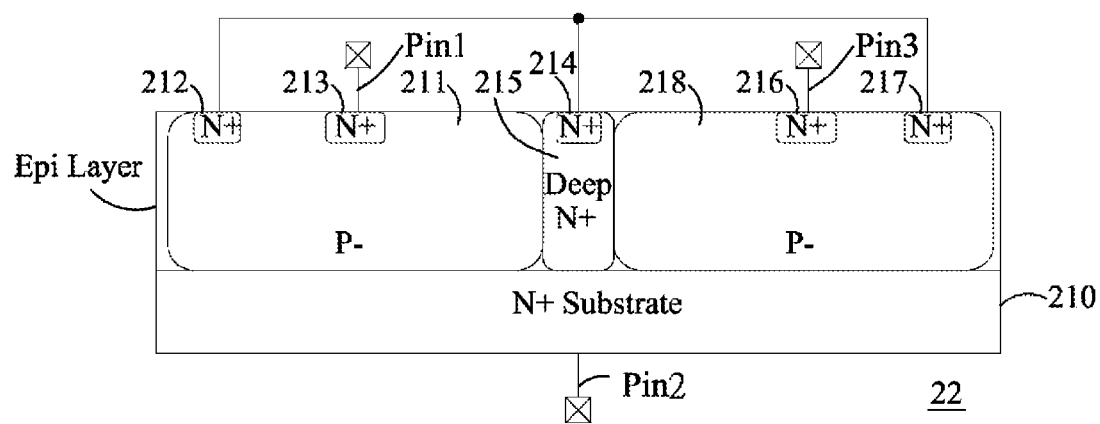
FIG. 2C is a cross-sectional view showing a vertical TVS 22 with multi-channel according to one embodiment of the present invention.

FIG. 2C is a cross-sectional view showing a vertical TVS 22 with multi-channel according one embodiment of the present invention. Although the embodiment has been shown and described with respect to two type lightly doped regions with one deep type heavily doped region, equivalent alterations and modifications will occur to others skilled in the art based upon a reading an understanding of this embodiment and the annexed drawings. The multi-channel vertical TVS 22 includes the conductivity type substrate 210 having highly doping concentration, the first type lightly doped region 211, the first type heavily doped region 212 and the second type heavily doped region 213, the deep first type heavily doped region 215, a second type lightly doped region 218, the fourth type heavily doped region 216 and the fifth type heavily doped region 217. The first type lightly doped region 211 arranged on the conductivity type substrate 210 and the conductivity type substrate 210 belong to opposite types. The first and second type heavily doped regions 212, 213 arranged in the first type lightly doped region 211 and the conductivity type substrate 210 belong to same types. The second type lightly doped region 218 arranged on the conductivity type substrate 210 and the conductivity type substrate 210 respectively belong to opposite types. The fourth type heavily doped region 216 and a fifth type heavily doped region 217 are arranged in the second type lightly doped region 218, wherein the fourth and fifth type heavily doped regions 216, 217 arranged in the second type lightly doped region 218 and the conductivity type substrate 210 belong to same types. The deep first type heavily doped region 215 arranged on the conductivity type substrate 210 neighbors the first and second type lightly doped regions 211, 218. The deep first type heavily doped region 215 coupled to the first and fifth type heavily doped regions 212, 217 and the first type lightly doped region 211 belong to opposite types. Furthermore, the first and second type lightly doped regions 211, 218 and the deep first type heavily doped region 215 are formed in the Epi layer on the conductivity type substrate 210, and a low resistance path is formed by the conductivity type substrate 210, the deep first type heavily doped region 215 and the first and fifth type heavily doped regions 212, 217. The vertical TVS 22 of the present invention further includes a third type heavily doped region 214 arranged in the deep first type heavily doped region 215 for coupling to the first and fifth type heavily doped region 212, 217 and further lowering the resistance between the deep first type heavily doped region 215 and the first and fifth type heavily doped regions 212, 217. The third type heavily doped region 214 and the deep first type heavily doped region 215 belong to same types. Preferably, the equivalent circuit (not shown in) of FIG. 2C includes plural vertical and lateral transistors according to actual requirement and design. As for the circuit operation and structure with equivalent circuit of FIG. 2C, please refer to related descriptions with reference to the embodiment of FIGS. 2A and 2B. Therefore, anyone with ordinary skill in the art can easily understand that, by using the combination with plural type lightly doped regions and deep type heavily doped regions of the present invention, any modification of the way is still within the scope of the present invention.

In the embodiment, the first and second P type lightly doped regions 211, 218 are arranged on the conductively N type substrate 210 having highly doping concentration. The first and second N type heavily doped regions 212, 213 are arranged in the first P type lightly doped region 211, and the fourth and fifth N type heavily doped regions 216, 217 are arranged in the second P type lightly doped region 218. The deep first N type heavily doped region 215 arranged on the conductivity N type substrate 210 neighbors the first and second P type lightly doped regions 211, 218, and is coupled to the first and fifth N type heavily doped regions 212, 217. The third N type heavily doped region 214 is arranged in the deep first N type heavily doped region 215 according to the actual requirement for coupling to the first and fifth N type heavily doped regions 212, 217 and further lowing the resistance between the deep first N type heavily doped region 215 and the first and fifth N type heavily doped regions 212, 217. Furthermore, the first and second P type lightly doped regions 211, 218 and the deep first N type heavily doped region 215 are arranged in the Epi layer on the conductivity N type substrate 210. Preferably, in another embodiment, the first and second N type lightly doped regions 211, 218 are arranged on the conductivity P type substrate 210. The first and second P type heavily doped regions 212, 213 are arranged in the first N type lightly doped region 211, and the fourth and fifth P type heavily doped regions 216, 217 are arranged in the second N type lightly doped region 218. The deep first P type heavily doped region 215 arranged on the conductivity P type substrate 210 neighbors the first and second N type lightly doped regions 211, 218, and is coupled to the first and fifth P type heavily doped regions 212, 217. The third P type heavily doped region 214 is arranged in the deep first P type heavily doped region 215 according to the actual requirement for coupling to the first and fifth P type heavily doped regions 212, 217 and further lowing the resistance between the deep first P type heavily doped region 215 and the first and fifth P type heavily doped regions 212, 217. Furthermore, the first and second N type lightly doped regions 211, 218 and the deep first P type heavily doped region 215 are arranged in the Epi layer on the conductivity P type substrate 210.

Figure 3A:
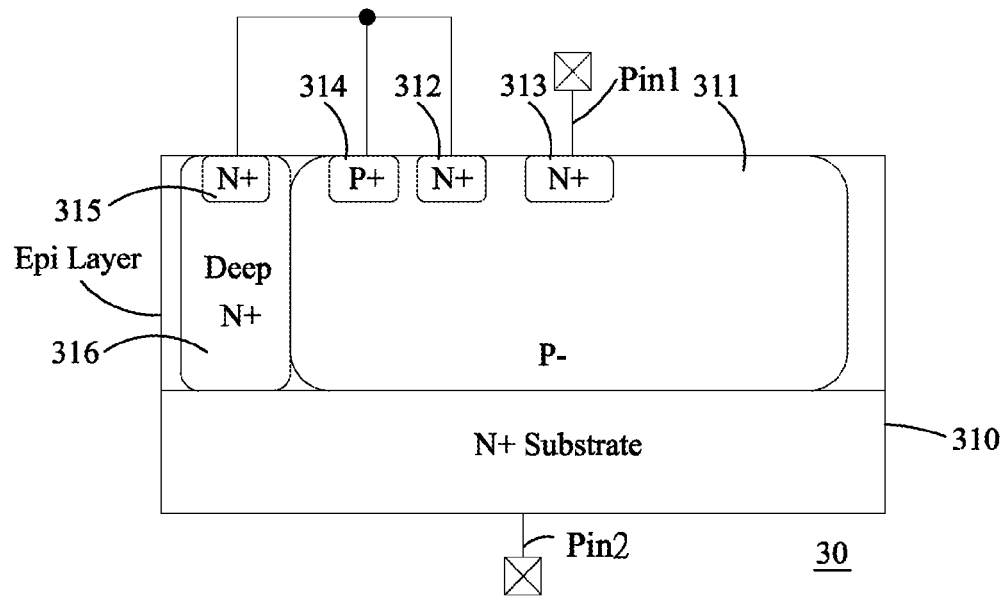
FIG. 3A is a cross-sectional view showing a vertical TVS 30 with single-channel according to one embodiment of the present invention.

FIG. 3A is a cross-sectional view showing a vertical TVS 30 with single-channel according to one embodiment of the present invention. The vertical TVS 30 includes a conductivity type substrate 310 having highly doping concentration, a first type lightly doped region 311, a first type heavily doped region 312, a second type heavily doped region 313, a third type heavily doped region 314 and a deep first type heavily doped region 316. The first type lightly doped region 311 arranged on the conductivity type substrate 310 and the conductivity type substrate 310 respectively belong to opposite types. The first type heavily doped region 312, the second type heavily doped region 313 and the third type heavily doped region 314 are arranged in the first type lightly doped region 311, wherein the first and second type heavily doped regions 312, 313 and the conductivity type substrate 310 belong to same types, and wherein the third type heavily doped region 314 and the first type heavily doped region 312 respectively belong to opposite types. The deep first type heavily doped region 316 is arranged on the conductivity type substrate 310 and neighbors the first type lightly doped region 311, wherein the deep first type heavily doped region 316 and the first type lightly doped region 311 respectively belong to opposite types, and wherein the deep first type heavily doped region 316 is coupled to the first and third type heavily doped regions 312, 314. The vertical TVS 30 of the present invention further includes a fourth type heavily doped region 315 arranged in the deep first type heavily doped region 316 for coupling to the first and third type heavily doped regions 312, 314 and lowing the resistance between the deep first type heavily doped region 316 and the first and third type heavily doped regions 312, 314, wherein the fourth type heavily doped region 315 and the deep first type heavily doped region 316 belong to same types.

Figure 3B:
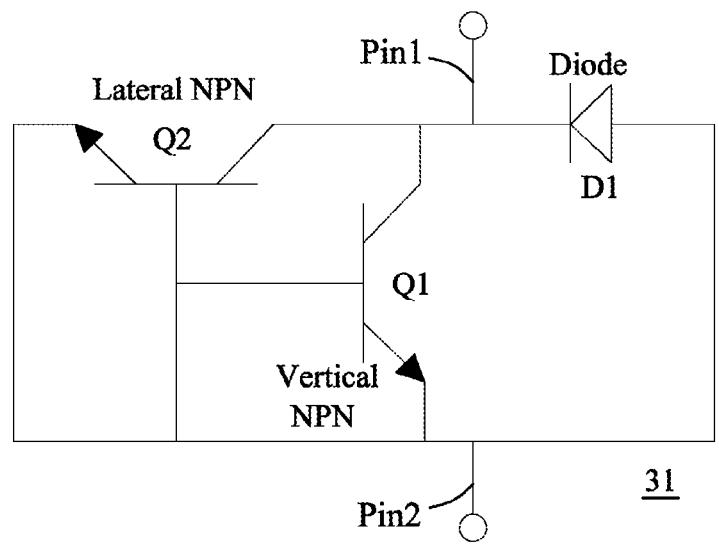
FIG. 3B is a schematic diagram showing an equivalent circuit 31 of FIG. 3A.

FIG. 3B is a schematic diagram showing an equivalent circuit 31 of FIG. 3A. The equivalent circuit 31 includes a vertical transistor Q1, a lateral transistor Q2 and a first diode D1. The first vertical transistor Q1 is formed by the conductivity type substrate 310, the first type lightly doped region 311 and the second type heavily doped region 313. The first lateral transistor Q2 is formed by the conductivity type substrate 310, the first type lightly doped region 311, the deep first type heavily doped region 316, the first type heavily doped region 312 coupled to the deep first type heavily doped region 316 and the second type heavily doped region 313, wherein the first vertical transistor Q1 is coupled to the first lateral transistor Q2 in parallel. The first diode D1 is formed by the conductivity type substrate 310, the deep first type heavily doped region 316, the third type heavily doped region 314 coupled to the deep first type heavily doped region 316 and the second type heavily doped region 313, wherein the first diode D1 is coupled to the first vertical transistor Q1.

In the embodiment, the first P type lightly doped region 311 is arranged on the conductivity N type substrate 310 having highly doping concentration. The first N type heavily doped region 312, the second N type heavily doped region 313 and the third P type heavily doped region 314 are arranged in the first P type lightly doped region 311. The deep first N type heavily doped region 316 is arranged on the conductivity N type substrate 310. Thereby, the equivalent circuit 31 included the vertical NPN BJT Q1, the lateral NPN BJT Q2 and the first diode D1 is formed. According to the embodiment, the vertical TVS 30 is uni-directional TVS. The positive ESD current can be discharged through the lateral NPN BJT Q1 and the vertical NPN BJT Q2 to a ground connected to the conductivity N type substrate 310. The negative ESD current can be discharged through the forward first diode D1 to the ground connected to the conductivity N type substrate 310.

According to another embodiment, the first N type lightly doped region 311 is arranged on the conductivity P type substrate 310 having highly doping concentration. The first P type heavily doped region 312, the second P type heavily doped region 313 and the third N type heavily doped region 314 are arranged in the first N type lightly doped region 311. The deep first P type heavily doped region 316 is arranged on the conductivity P type substrate 310. Thereby, the equivalent circuit 31 included the vertical PNP BJT Q1, the lateral PNP BJT Q2 and the first diode D1 is formed. According to the embodiment, the vertical TVS 30 is uni-directional TVS. The positive ESD current can be discharged through the lateral PNP BJT Q1 and the vertical PNP BJT Q2 to a ground connected to the conductivity P type substrate 310. The negative ESD current can be discharged through the forward first diode D1 to the ground connected to the conductivity P type substrate 310.

Figure 3C:
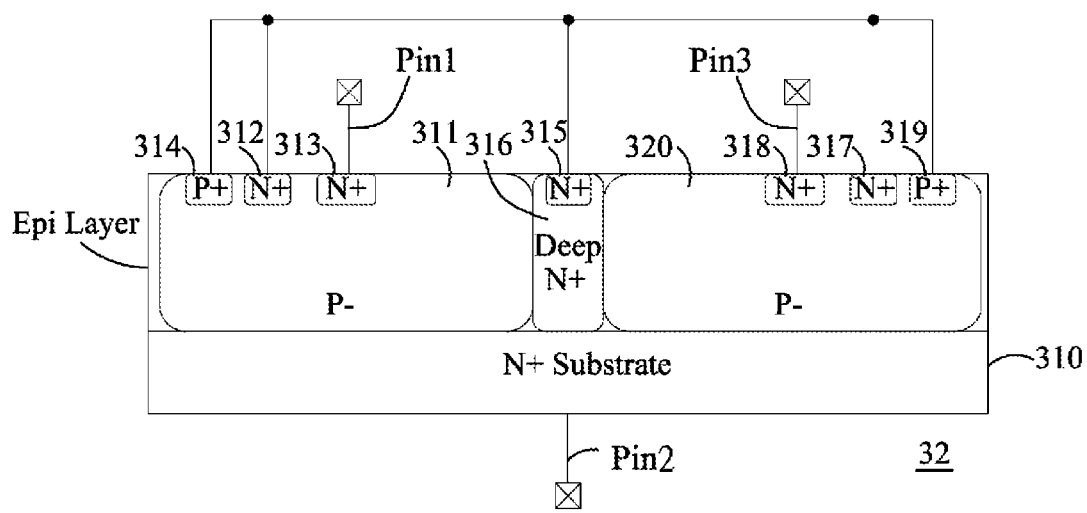
FIG. 3C is a cross-sectional view showing a vertical TVS 32 with multi-channel according to one embodiment of the present invention.

FIG. 3C is a cross-sectional view showing a vertical TVS 32 with multi-channel according to one embodiment of the present invention. Although the embodiment has been shown and described with respect to two type lightly doped regions with one deep type heavily doped region, equivalent alterations and modifications will occur to others skilled in the art based upon a reading an understanding of this embodiment and the annexed drawings. The multi-channel vertical TVS 32 includes a conductivity type substrate 310 having highly doping concentration, a first type lightly doped region 311, a first type heavily doped region 312, a second type heavily doped region 313, a third type heavily doped region 314, a deep first type heavily doped region 316, a second type lightly doped region 320, a fifth type heavily doped region 317, a sixth type heavily doped region 318 and a seventh type heavily doped region 319. The first type lightly doped region 311 arranged on the conductivity type substrate 310 and the conductivity type substrate 310 respectively belong to opposite types. The first type heavily doped region 312, the second type heavily doped region 313 and the third type heavily doped region 314 are arranged in the first type lightly doped region 311, wherein the first and second type heavily doped regions 312, 313 and the conductivity type substrate 310 belong to same types, and wherein the third type heavily doped region 314 and the first type heavily doped region 312 respectively belong to opposite types. The deep first type heavily doped region 316 is arranged on the conductivity type substrate 310 and neighbors the first and second type lightly doped regions 311, 320, wherein the deep first type heavily doped region 316 and the first type lightly doped region 311 respectively belong to opposite types, and wherein the deep first type heavily doped region 316 is coupled to the first and third type heavily doped regions 312, 314. The second type lightly doped region 320 is arranged on the conductivity type substrate 310, wherein the second type lightly doped region 320 and the conductivity type substrate 310 respectively belong to opposite types. The fifth type heavily doped region 317, the sixth type heavily doped region 318 and the seventh type heavily doped region 319 are arranged in the second type lightly doped region 320, wherein the fifth and sixth type heavily doped regions 317, 319 and the conductivity type substrate 310 belong to same types, and wherein the seventh type heavily doped region 319 and the fifth type heavily doped region 317 respectively belong to opposite types, and wherein the fifth and seventh type heavily doped regions 317, 319 are coupled to the deep first type heavily doped region 316. The vertical TVS 30 of the present invention further includes a fourth type heavily doped region 315 arranged in the deep first type heavily doped region 316 for coupling to the first, third, fifth and seventh type heavily doped regions 312, 314, 317 and 319 and lowing the resistance between the deep first type heavily doped region 316 and the first, third, fifth and seventh type heavily doped regions 312, 314, 317 and 319. The fourth type heavily doped region 315 and the deep first type heavily doped region 316 belong to same types. Preferably, the equivalent circuit (not shown in) of FIG. 3C includes plural vertical and lateral transistors according to actual requirement and design. As for the circuit operation and structure with equivalent circuit of FIG. 3C, please refer to related descriptions with reference to the embodiment of FIGS. 3A and 3B. Therefore, anyone with ordinary skill in the art can easily understand that, by using the combination with plural type lightly doped regions and deep type heavily doped regions of the present invention, any modification of the way is still within the scope of the present invention.

In the embodiment, the first and second P type lightly doped regions 311, 320 are arranged on the conductivity N type substrate 310 having highly doping concentration. The first N type, the second N type and the third P type heavily doped regions 312, 313 and 314 are arranged in the first P type lightly doped region 311, and the fifth N type, the sixth N type and the seventh P type heavily doped regions 317, 318 and 319 are arranged in the second P type lightly doped region 320. The deep first N type heavily doped region 316 arranged on the conductivity N type substrate 310 neighbors the first and second P type lightly doped regions 311, 320, and is coupled to the first N type, the third P type, the fifth N type and the seventh P type heavily doped regions 312, 314, 317 and 319. The fourth N type heavily doped region 315 is arranged in the deep first N type heavily doped region 316 according to the actual requirement for coupling to the first N type, the third P type, the fifth N type and the seventh P type heavily doped regions 312, 314, 317 and 319 and further lowing the resistance between the deep first N type heavily doped region 316 and the first N type, the third P type, the fifth N type and the seventh P type heavily doped regions 312, 314, 317 and 319. Furthermore, the first and second P type lightly doped regions 311, 320 and the deep first N type heavily doped region 316 are arranged in the Epi layer on the conductivity N type substrate 310. Preferably, in another embodiment, the first and second N type lightly doped regions 311, 320 are arranged on the conductivity P type substrate 310 having highly doping concentration. The first P type, the second P type and the third N type heavily doped regions 312, 313 and 314 are arranged in the first N type lightly doped region 311, and the fifth P type, the sixth P type and the seventh N type heavily doped regions 317, 318 and 319 are arranged in the second N type lightly doped region 320. The deep first P type heavily doped region 316 arranged on the conductivity P type substrate 310 neighbors the first and second N type lightly doped regions 311, 320, and is coupled to the first P type, the third N type, the fifth P type and the seventh N type heavily doped regions 312, 314, 317 and 319. The fourth P type heavily doped region 315 is arranged in the deep first P type heavily doped region 316 according to the actual requirement for coupling to the first P type, the third N type, the fifth P type and the seventh N type heavily doped regions 312, 314, 317 and 319 and further lowing the resistance between the deep first P type heavily doped region 316 and the first P type, the third N type, the fifth P type and the seventh N type heavily doped regions 312, 314, 317 and 319. Furthermore, the first and second N type lightly doped regions 311, 320 and the deep first P type heavily doped region 316 are arranged in the Epi layer on the conductivity P type substrate 310.

Figure 4A:
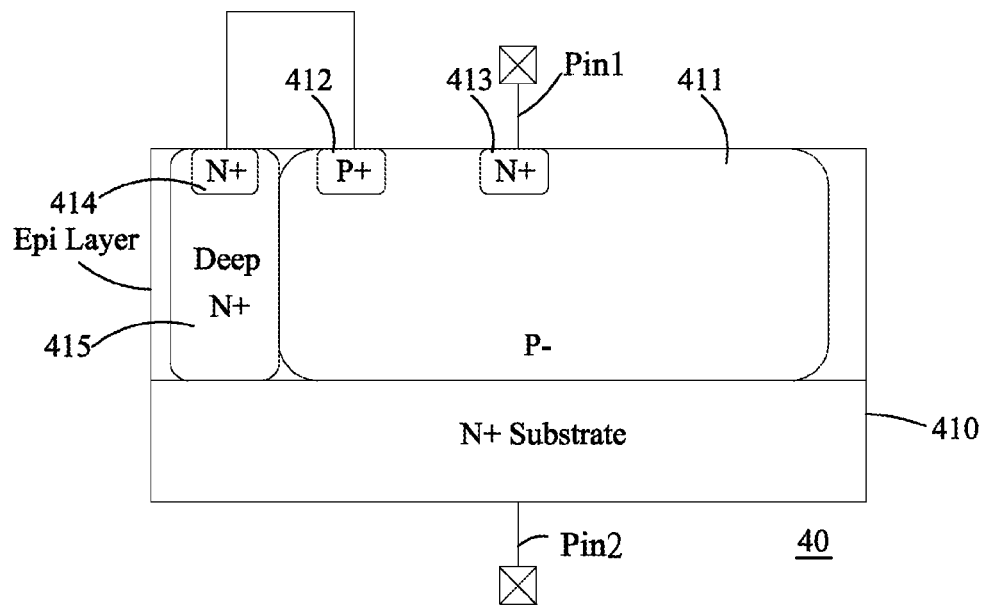
FIG. 4A is a cross-sectional view showing a vertical TVS 40 according to one embodiment of the present invention.

FIG. 4A is a cross-sectional view showing a vertical TVS 40 with single-channel according to one embodiment of the present invention. The vertical TVS 40 includes a conductivity type substrate 410 having highly doping concentration, a first type lightly doped region 411, a first type heavily doped region 412 and a second type heavily doped region 413, and a deep first type heavily doped region 415. The first type lightly doped region 411 is arranged on the conductivity type substrate 410, wherein the first type lightly doped region 411 and the conductivity type substrate 410 respectively belong to opposite types. The first type heavily doped region 412 and the second type heavily doped region 413 are arranged in the first type lightly doped region 411, wherein the first and second type heavily doped regions 412, 413 respectively belong to opposite types, and wherein the second type heavily doped region 413 and the conductivity type substrate 410 belong to same types. The deep first type heavily doped region 415 is arranged on the conductivity type substrate 410 and neighbors the first type lightly doped region 411, wherein the deep first type heavily doped region 415 and the first type lightly doped region 411 respectively belong to opposite types, and wherein the deep first type heavily doped region 415 is coupled to the first type heavily doped region 412. The vertical TVS 40 further includes a third type heavily doped region 414 arranged in the deep first type heavily doped region 415 for coupling to the first type heavily doped region 412 and further lowing the resistance between the deep first type heavily doped region 415 and the first type heavily doped region 412, wherein the third type heavily doped region 414 and the deep first type heavily doped region 415 belong to same types.

Figure 4B:
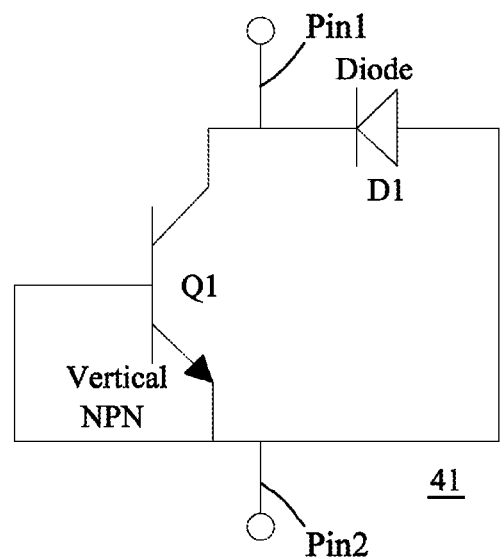
FIG. 4B is a schematic diagram showing an equivalent circuit 41 of FIG. 4A.

FIG. 4B is a schematic diagram showing an equivalent circuit 41 of FIG. 4A. The equivalent circuit 41 includes a first vertical transistor Q1 and a first diode D1. The first vertical transistor Q1 is formed by the conductivity type substrate 410, the first type lightly doped region 411, and the second type heavily doped region 413. The first diode D1 is formed by the conductivity type substrate 410, the deep first type heavily doped region 415, the first type heavily doped region 412 coupled to the deep first type heavily doped region 415 and the second type heavily doped region 413, wherein the first diode D1 is coupled to the first vertical transistor Q1.

In the embodiment, the first P type lightly doped region 411 is arranged on the conductivity N type substrate 410 having highly doping concentration. The first P type heavily doped region 412 and the second N type heavily doped region 413 are arranged in the first P type lightly doped region 411. The deep first N type heavily doped region 415 is arranged on the conductivity N type substrate 410 and coupled to the first P type heavily doped region 412. According to the embodiment, the vertical TVS 40 is uni-directional TVS. The positive ESD current can be discharged through the vertical NPN BJT Q1 to a ground connected to the conductivity N type substrate 410. The negative ESD current can be discharged through the forward first diode D1 to a ground connected to the N type substrate. The third N type heavily doped region 414 is arranged in the deep first N type heavily doped region 415 according to the actual requirement for coupling to the first P type heavily doped region 412 and further lowing the resistance between the deep first N type heavily doped region 415 and the first P type heavily doped region 412.

According to another embodiment, the first N type lightly doped region 411 is arranged on the conductivity P type substrate 410 having highly doping concentration. The first N type heavily doped region 412 and the second P type heavily doped region 413 are arranged in the first N type lightly doped region 411. The deep first P type heavily doped region 415 is arranged on the conductivity P type substrate 410 and coupled to the first N type heavily doped region 412. According to the embodiment, the vertical TVS 40 is uni-directional TVS. The positive ESD current can be discharged through the vertical PNP BJT Q1 to a ground connected to the conductivity P type substrate 410. The negative ESD current can be discharged through the forward first diode D1 to a ground connected to the P type substrate 410. The third P type heavily doped region 414 is arranged in the deep first P type heavily doped region 415 according to the actual requirement for coupling to the first N type heavily doped region 412 and further lowing the resistance between the deep first P type heavily doped region 415 and the first N type heavily doped region 412.

Figure 4C:
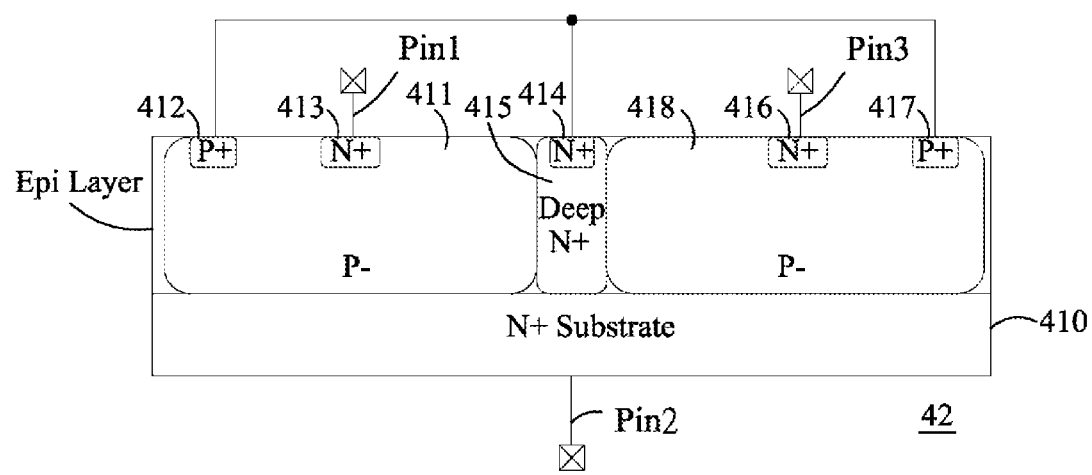
FIG. 4C is a cross-sectional view showing a vertical TVS 42 with multi-channel according to one embodiment of the present invention.

FIG. 4C is a cross-sectional view showing a vertical TVS 42 with multi-channel according to one embodiment of the present invention. The vertical TVS 42 includes a conductivity type substrate 410 having highly doping concentration, a first type lightly doped region 411, a first type heavily doped region 412 and a second type heavily doped region 413, a second type lightly doped region 418, a fourth type heavily doped region 416, a fifth type heavily doped region 417 and a deep first type heavily doped region 415. The first type lightly doped region 411 is arranged on the conductivity type substrate 410, wherein the first type lightly doped region 411 and the conductivity type substrate 410 respectively belong to opposite types. The first type heavily doped region 412 and the second type heavily doped region 413 are arranged in the first type lightly doped region 411, wherein the first and second type heavily doped regions 412, 413 respectively belong to opposite types, and wherein the second type heavily doped region 413 and the conductivity type substrate 410 belong to same types. The second type lightly doped region 418 is arranged on the conductivity type substrate 410, wherein the second type lightly doped region 418 and the conductivity type substrate 410 respectively belong to opposite types. The fourth and fifth type heavily doped regions 416, 417 are arranged in the second type lightly doped region 418, wherein the fourth and fifth type heavily doped regions 416, 417 respectively belong to opposite types, and wherein the fourth type heavily doped region 416 and the conductivity type substrate 410 belong to same types. The deep first type heavily doped region 415 is arranged on the conductivity type substrate 410 and neighbors the first and second type lightly doped regions 411, 418, wherein the deep first type heavily doped region 415 and the first type lightly doped region 411 respectively belong to opposite types, and wherein the deep first type heavily doped region 415 is coupled to the first and fifth type heavily doped regions 412, 417. The vertical TVS 40 further includes a third type heavily doped region 414 is arranged in the deep first type heavily doped region 415 for coupling to the first and fifth type heavily doped regions 412, 417 and further lowering the resistance between the deep first type heavily doped region 415 and the first and fifth type heavily doped regions 412, 417, wherein the third type heavily doped region 414 and the deep first type heavily doped region 415 belong to same types. As for the circuit operation and structure with equivalent circuit of FIG. 4C, please refer to related descriptions with reference to the embodiment of FIGS. 4A and 4B. Therefore, anyone with ordinary skill in the art can easily understand that, by using the combination with plural type lightly doped regions and deep type heavily doped regions of the present invention, any modification of the way is still within the scope of the present invention.

In the embodiment, the first and second P type lightly doped regions 411, 418 are arranged on the conductivity N type substrate 410. The first P type heavily doped region 412 and the second N type heavily doped region 413 are arranged in the first P type lightly doped region 411. The fourth N type heavily doped region 416 and the fifth P type heavily doped region 417 are arranged in the second P type lightly doped region 418. The deep first N type heavily doped region 415 arranged on the conductivity N type substrate 410 neighbors the first and second P type lightly doped regions 411, 418, and is coupled to the first and fifth P type heavily doped regions 412, 417. The vertical TVS 40 further includes a third N type heavily doped region 414 arranged in the deep first N type heavily doped region 415 according to the actual requirement for coupling to the first and fifth P type heavily doped regions 412, 417 and further lowering the resistance between the deep first N type heavily doped region 415 and the first and fifth P type heavily doped regions 412, 417. Preferably, in another embodiment, the first and second N type lightly doped regions 411, 418 are arranged on the conductivity P type substrate 410 having highly doping concentration. The first N type heavily doped region 412 and the second P type heavily doped region 413 are arranged in the first N type lightly doped region 411. The fourth P type heavily doped region 416 and the fifth N type heavily doped region 417 are arranged in the second N type heavily doped region 418. The deep first P type heavily doped region 415 arranged on the conductivity P type substrate 410 neighbors the first and second N type lightly doped regions 411, 418, and is coupled to the first and fifth N type heavily doped regions 412, 417. The vertical TVS 40 further includes a third P type heavily doped region 414 arranged in the deep first P type heavily doped region 415 according to the actual requirement for coupling to the first and fifth N type heavily doped regions 412, 417 and further lowering the resistance between the deep first P type heavily doped region 415 and the first and fifth N type heavily doped regions 412, 417.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A vertical transient voltage suppressor for ESD protection, comprising:
    a conductivity type substrate, having highly doping concentration and being a first type;
    a first lightly doped region, arranged on the conductivity type substrate and being a second type;
    a first heavily doped region, completely formed within the first lightly doped region and being the first type;
    a second heavily doped region, completely formed within the first lightly doped region and being the first type;
    a first deep heavily doped region, being the first type, arranged on the conductivity type substrate, neighboring the first lightly doped region, and coupled to the first heavily doped region; and
    a first pin, connected to the second heavily doped region, wherein the first pin is connected to a circuit terminal to be protected;
    a second pin, connected to the conductivity type substrate, wherein the second pin is connected to a ground terminal;
    wherein the first type and the second type are opposite.

2. The vertical transient voltage suppressor according to claim 1, wherein the first type is N type, and the second type is P type.

3. The vertical transient voltage suppressor according to claim 1, further comprising:
    a third heavily doped region, formed in the first deep heavily doped region, wherein the third heavily doped region and the first deep heavily doped region are the first type, and the first deep heavily doped region couples to the first heavily doped region via the third heavily doped region.

4. The vertical transient voltage suppressor according to claim 1, further comprising:
    a second lightly doped region, arranged on the conductivity type substrate, and being the second type; and a fourth heavily doped region, completely formed in the second lightly doped region, and being the first type; and a fifth heavily doped region, completely formed in the second lightly doped region, and being the first type; and a third pin, connected to the fourth heavily doped region, wherein the third pin is connected to another circuit terminal to be protected, wherein the fifth deep heavily doped region is coupled to the first deep heavily doped region via the third heavily doped region.

5. The vertical transient voltage suppressor according to claim 4, wherein the second type is P type, and the first type is N type.

6. A vertical transient voltage suppressor for ESD protection, comprising:

a conductivity type substrate having highly doping concentration and being a first type;

a first lightly doped region, arranged on the conductivity type substrate and being a second type;

a first heavily doped region, completely formed within the first lightly doped region and being the first type;

a second heavily doped region, completely formed within the first lightly doped region and being the first type;

a third heavily doped region, completely formed within the first lightly doped region and being the second type;

a first deep heavily doped region, arranged on the conductivity type substrate, neighboring the first lightly doped region, being the first type, and coupled to both the first heavily doped region and the third heavily doped region; and a first pin, connected to the second heavily doped region, wherein the first pin is connected to a circuit terminal to be protected;

a second pin, connected to the conductivity type substrate, wherein the second pin is connected to a ground terminal; wherein the first type and the second type are opposite types.

7. The vertical transient voltage suppressor according to claim 6, wherein the first type is N type, and the second type is P type.

8. The vertical transient voltage suppressor according to claim 6, further comprising:

a fourth heavily doped region, formed in the first deep heavily doped region and being the first type;

wherein the first deep heavily doped region is coupled to the first and third heavily doped regions via the fourth heavily doped region.

9. The vertical transient voltage suppressor according to claim 6, further comprising:

a second lightly doped region, arranged on the conductivity type substrate and being the second type;

a fifth heavily doped region completely formed in the second lightly doped region and being the first type;

a sixth heavily doped region, completely formed in the second lightly doped region and being the first type; and a seventh heavily doped region, completely formed in the second lightly doped region and being the second type; and a third pin, connected to the sixth heavily doped region, wherein the third pin is connected to another circuit terminal to be protected;

wherein the fifth heavily doped region and the seventh heavily doped region are coupled to the first deep heavily doped region via the fourth heavily doped region.

10. The vertical transient voltage suppressor according to claim 9, the second type is P type, and the first type is N type.

11. A vertical transient voltage suppressor for ESD protection, comprising:

a conductivity type substrate having highly doping concentration and being a first type;

a first lightly doped region, arranged on the conductivity type substrate and being a second type;

a first heavily doped region, completely formed within the first lightly doped region and being the first type;

a second heavily doped region, completely formed within the first lightly doped region and being the second type;

a first deep heavily doped region, arranged on the conductivity type substrate, neighboring the first lightly doped region, being the first type, and coupled to the second heavily doped region;

a first pin, connected to the first heavily doped region, wherein the first pin is connected to a circuit terminal to be protected; and a second pin, connected to the conductivity type substrate, wherein the second pin is connected to a ground terminal;

wherein the first type and the second type are opposite types.

12. The vertical transient voltage suppressor according to claim 11, wherein the first type is N type, and the second type is P type.

13. The vertical transient voltage suppressor according to claim 11, further comprising:

a third heavily doped region, formed in the first deep heavily doped region;

wherein the first deep heavily doped region is coupled to the second heavily doped region via the third heavily doped region.

14. The vertical transient voltage suppressor according to claim 11, further comprising:

a second lightly doped region, arranged on the conductivity type substrate and being the second type;

a fourth heavily doped region, completely formed in the second lightly doped region and being the first type;

a fifth heavily doped region, completely formed in the second lightly doped region and being the second type;

a third pin, connected to the fourth heavily doped region, wherein the third pin is connected to another circuit terminal to be protected;

wherein the fifth heavily doped region is coupled to the first deep heavily doped region via the third heavily doped region.

15. The vertical transient voltage suppressor according to claim 14, wherein the first type is N type, and the second type is P type.

* * * * *